(12) United States Patent
Mariani et al.

(10) Patent No.: US 8,017,942 B2
(45) Date of Patent: Sep. 13, 2011

(54) SEMICONDUCTOR DEVICE AND METHOD

(75) Inventors: Franco Mariani, Bad Abbach (DE); Werner Kroeninger, Regensburg (DE); Adolf Koller, Regensburg (DE); Horst Theuss, Wenzenbach (DE); Jens Arkenau, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/277,894

(22) Filed: Nov. 25, 2008

(65) Prior Publication Data

US 2010/0127355 A1    May 27, 2010

(51) Int. Cl.
*H01L 23/58* (2006.01)
*H01L 29/10* (2006.01)

(52) U.S. Cl. ......... 257/48; 257/E23.179; 257/E23.194; 438/14

(58) Field of Classification Search .............. None
See application file for complete search history.

(56) References Cited

U.S. PATENT DOCUMENTS

| | | | |
|---|---|---|---|
| 5,206,181 A * | 4/1993 | Gross | 438/18 |
| 5,477,062 A * | 12/1995 | Natsume | 257/48 |
| 5,654,582 A * | 8/1997 | Kijima et al. | 257/620 |
| 2005/0006728 A1 | 1/2005 | Shizuno | |
| 2006/0073677 A1 * | 4/2006 | Nakamura | 438/460 |
| 2007/0066044 A1 | 3/2007 | Abe et al. | |
| 2008/0142798 A1 * | 6/2008 | Kuo et al. | 257/48 |
| 2008/0164468 A1 * | 7/2008 | Chen et al. | 257/48 |

FOREIGN PATENT DOCUMENTS

| | | |
|---|---|---|
| JP | 2005340423 A | 12/2005 |
| WO | 2007055010 A1 | 5/2007 |

OTHER PUBLICATIONS

"Stealth Dicing Technology and Applications", Hamamatsu, Mar. 2005.
"Stealth Dicing Application", extract from Disco, Kiru, Kezuru, Migaku Topics, 2001, DISCO.
"Wafer Dicing Machines", Accretech, 2007, Tokyo Seimitsu Co., Ltd.

* cited by examiner

*Primary Examiner* — Ha Tran T Nguyen
*Assistant Examiner* — Shaka Scarlett
(74) *Attorney, Agent, or Firm* — Dicke, Billig & Czaja, PLLC

(57) ABSTRACT

A semiconductor device and method. One embodiment provides a semiconductor substrate having a plurality of cut regions. A metal layer is located within a cut region. The metal layer includes a recess, the recess having a slit-like shape.

14 Claims, 7 Drawing Sheets

FIG 18

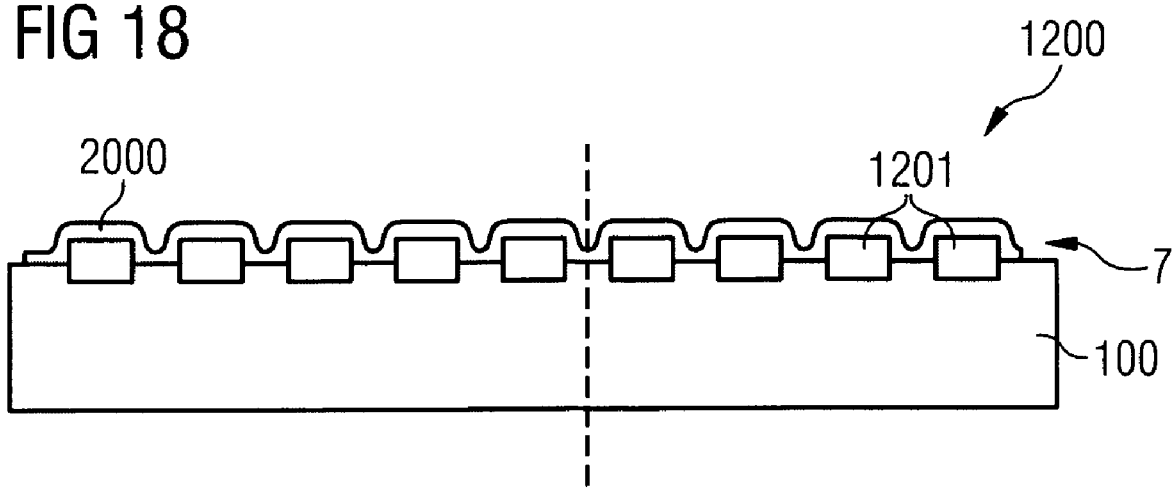

FIG 19

| Step |
|---|
| Preparing a semiconductor wafer having a plurality of active regions therein, wherein active regions being separated by cut regions — S1 |
| Generating a metal layer located within a cut region, wherein the metal layer comprises a recess, the recess having a slit-like shape — S2 |
| Separating a semiconductor wafer into at least two semiconductor units by laser dicing, wherein the cutting line runs through the recess — S3 |

SEMICONDUCTOR DEVICE AND METHOD

BACKGROUND

The invention relates to a semiconductor device and a method of manufacturing a semiconductor device, and the technology of separating a semiconductor substrate such as e.g., a wafer into semiconductor units such as e.g., chips.

Semiconductor wafers are separated into semiconductor chips for producing the same. Recently, laser dicing became increasingly attractive for various reasons, amongst them its potential to avoid cutting waste and to provide for a dry cutting process.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 18 illustrates a sectional view along line C-C of one embodiment of the semiconductor device illustrated in FIG. 17;

FIG. 19 illustrates a flow diagram of a method of producing semiconductor units according to one embodiment.

DETAILED DESCRIPTION

Figure 1:
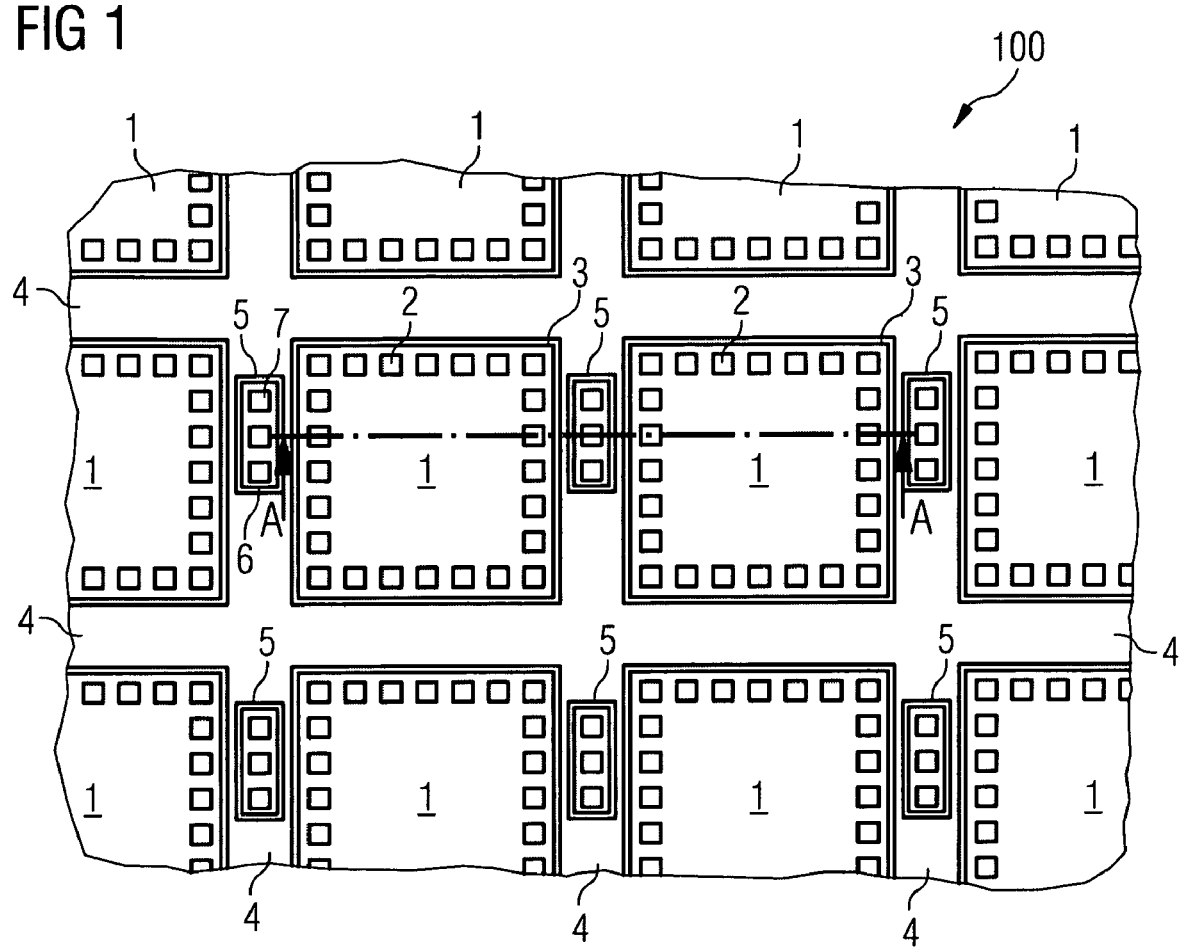
FIG. 1 illustrates a plan view of a part of a semiconductor device according to one embodiment.

Aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. The following description is therefore not to be taken in a limiting sense, and the scope is defined by the appended claims. It should also be noted that the representations of the various layers, sheets or substrates in the Figures are not necessarily to scale.

In the following detailed description, reference is made to the accompanying drawings, which form a part thereof, and in which is shown by way of illustration specific embodiments in which the invention may be practiced. In this regard, directional terminology, such as "upper", "lower", "left-hand", "right-hand", "front side", "backside", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

The semiconductor wafers and chips described further below may be of different types, may be manufactured by different technologies and may include, for example, integrated electrical, electro-optical or electro-mechanical circuits and/or passives. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor wafers and chips may include control circuits, microprocessors or microelectromechanical components. Semiconductor chips having a vertical structure may be involved, that is to say that the semiconductor chips may be fabricated in such a way that electric currents can flow in a direction perpendicular to the main surfaces of the semiconductor chips. A semiconductor wafer or chip having a vertical structure may have contact elements in particular on its two main surfaces, that is to say on its front side and backside. Power semiconductor chips and corresponding wafers may have a vertical structure. By way of example, the source electrode and gate electrode of a power MOSFET may be situated on one main surface, while the drain electrode of the power MOSFET is arranged on the other main surface. Furthermore, the devices described below may include integrated circuits to control the integrated circuits of other semiconductor chips, for example, the integrated circuits of power semiconductor chips. The semiconductor wafers and chips need not be manufactured from specific semiconductor material, for example, Si, SiC, SiGe, GaAs, and, furthermore, may contain inorganic and/or organic materials that are not semiconductors, such as, for example, insulators, plastics or metals.

In several embodiments layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), etc.

Furthermore the semiconductor wafers and chips described below may include contact elements or contact pads on one or more of their outer surfaces wherein the contact elements serve for electrically contacting the semiconductor chips or other circuits integrated in the semiconductor wafer. The contact elements may have the form of lands, i.e. flat contact layers on an outer surface of the semiconductor wafer or chip. The metal layer(s) of which the contact elements are made may be manufactured with any desired material composition. The metal layer(s) may, for example, be in the form of a layer covering an area. Any desired metal or metal alloy, for example, aluminum, titanium, gold, silver, copper, palladium, platinum, nickel, chromium or nickel vanadium, may be used as the material. The metal layer(s) need not be homogenous or manufactured from just one material, that is to say various compositions and concentrations of the materials contained in the metal layer(s) are possible. The contact elements may be situated on the active main surfaces of the semiconductor chips or on other surfaces of the semiconductor chips.

The semiconductor devices may include one or more electrically insulating layers. In particular the semiconductor wafers and chips may be covered with an electrically insulating layer such as a dielectric hard passivation layer.

The semiconductor wafer and chips may have metal layers used as wiring layers to make electrical contact with integrated circuits or other components contained in the semiconductor wafer. The metal layers may be manufactured with any desired geometric shape and any desired material composition. The metal layers may, for example, be composed of conductor tracks or wires, but may also be in the form of a layer covering an area. Any desired metal, for example, aluminum, nickel, palladium, silver, tin, gold or copper, or metal alloy may be used as the material. The metal layers need not be homogenous or manufactured from just one material, that is to say various compositions and concentrations of the materials contained in the metal layers are possible.

FIG. 1 illustrates a plan view schematically illustrating a part of a main (front) surface of a semiconductor device 100 according to a first exemplary embodiment. The semiconductor device 100 is e.g., made of a wafer or any other semiconductor substrate prior to be diced into semiconductor units such as e.g., chips.

In the following and throughout the description below, the semiconductor device 100 is assumed to be a wafer and the semiconductor units are taken to be chips. However, the following description is to be understood in greater generality and may be applied to any kind of semiconductor units individualized from any kind of semiconductor substrate.

Semiconductor wafer 100 includes a plurality of effective chip areas 1 to be individualized via a subsequent dicing process. The effective chip areas 1 may be disposed in a matrix form. They may be of any physical shape, e.g., circular or polygonal.

Electrode pads 2 made of a metal or another material as mentioned above may be formed on the semiconductor wafer 100 within the effective chip area 1. The electrode pads 2 may be formed within a hard passivation layer 3 such as e.g., a silicon oxide or a nitride layer.

Each effective chip area 1 illustrated in FIG. 1 may include an active or processed surface of the semiconductor wafer 100. For example, an integrated circuit may be implemented within the effective chip area 1 and coupled to the electrode pads 2 by an internal wiring generated during wafer front-end processing. A large variety of different types of active regions may be implemented within the effective chip area 1 in accordance with the above description. By way of example, the active chip area 1 may include transistors, capacitors, all kind of circuitry made thereof, MEMS, etc.

The effective chip areas 1 are separated (i.e. spaced apart) by cut or dicing regions 4. The dicing regions 4, also referred to in the art as dicing streets, may be linear or may have any other suitable shape. The dicing areas 4 are intended to provide space which is necessary for cutting the wafer 100 into single chips. Typically, such intermediate space between effective chip areas 1 may be used for contact structures 5. Contact structures 5 may e.g., be employed for test or control purposes. For instance, contact structures 5 may provide electrodes of a TEG (Test Element Group) which is used during wafer testing, or may constitute electrodes for wafer burn-in processes, shielding or other purposes.

By way of example, a contact structure 5 may include a hard passivation layer 6 and one or more metallizations 7 embedded in the hard passivation layer 6. The metallizations 7 may be coupled to one or more components (integrated circuits, MEMS etc.) within the effective chip areas 1 by internal wiring. Typically, the metallizations 7 are exposed and/or may easily be contacted by a contact pin or probe coupled to an external monitoring, testing or controlling device.

In the following, a laser dicing process is considered to individualize the chips, see FIG. 2. A specific technology of laser dicing is known in the art as stealth dicing. Stealth dicing allows to suppress cutting waste and is therefore a suitable process for cutting work pieces that are vulnerable to contamination. Further, it is a dry process that does not require cleaning, and is therefore suitable for processing sensitive structures such as e.g., MEMS, that are vulnerable to load. Further benefits which may be achieved by the stealth dicing technology are high-speed dicing, superior breakage strength, small kerf and low running costs.

In stealth dicing technology, a laser beam 8 of a wavelength capable of transmitting through the semiconductor wafer 100 is focused onto a point P inside the semiconductor wafer 100. Due to a non-linear absorption effect, only localized points P inside the semiconductor wafer 100 may be selectively laser-machined, whereby damaging of the front and back surface of the semiconductor wafer 100 may be avoided. The semiconductor wafer 100 can be diced by moving the relative positions of the laser beam 8 and the semiconductor wafer 100 in order to scan the semiconductor wafer 100 according to the desired dicing pattern. One example embodiment of stealth dicing is illustrated in FIG. 2.

Figure 2:
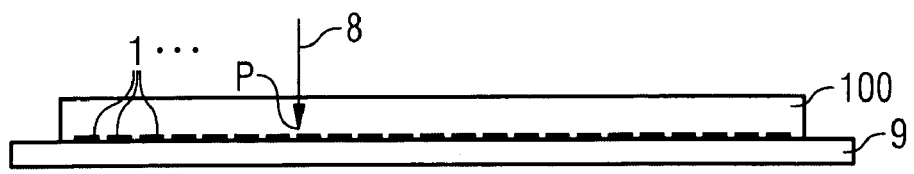
FIG. 2 illustrates a sectional view of one embodiment of a semiconductor device when being placed on a tape.

FIG. 2 illustrates a sectional view of a semiconductor wafer 100. The contact structures 5 and details of the effective chip areas 1 (e.g., electrode pads 2, hard passivation layer 3) are not illustrated in FIG. 2.

According to FIG. 2, the semiconductor wafer 100 may be mounted on an expandable tape 9. Before applying the focused laser beam 8 to the semiconductor wafer 100, the semiconductor wafer 100 may be ground. After laser (stealth) dicing, the expandable tape 9 is expanded in all lateral directions. Tape expansion may cause the chips to individualize along the line of punctual damages created by the focused laser beam 8. As apparent from FIG. 2, the laser beam 8 may be applied from the backside of the semiconductor wafer 100, i.e. the laser beam 8 may be directed to a main surface of the semiconductor wafer 100 which is opposite to the main surface of the semiconductor wafer 100 illustrated in FIG. 1, which accommodates the effective chip areas 1.

The separation of the semiconductor wafer 100 in single chips may be impeded or the quality of the separation process may worsen if the cutting line intersects metal material such as e.g., the metallizations 7. Metal material rather scatters the laser light than being cut. The longer the intersection length between a metal layer (e.g., metallization 7 or any other internal metal layer) and the cutting line and/or the thicker a metal layer, the lower process reliability is to be expected. For instance, a metal layer crossing a cutting line may act like a clamp and, as a result, may prevent the separation of the semiconductor material at the cutting line. Alternatively, if the separation was successful, the metal layer (e.g., metallization 7 or any other internal metal layer) may fray out when being torn apart. Fraying out of a metal layer may be detrimental to chip product quality and process reliability.

Figure 3:
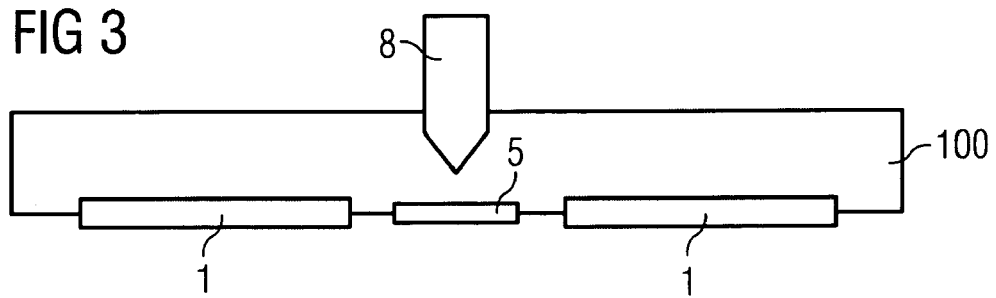
FIG. 3 illustrates a sectional view along line A-A of one embodiment of the semiconductor device illustrated in FIG. 1.

FIG. 3 illustrates a sectional view of the semiconductor wafer 100 along line A-A in FIG. 1. Optional layers of the contact structure 5 such as e.g., passivation layer 6 are not depicted. By way of example, the laser beam 8 may be aligned to move along the center line of the metallization 7 which is oriented parallel to the dicing street. FIGS. 4 to 18 illustrate several designs of the metallization 7 or other metal layers according to implementations and embodiments. FIGS. 4 to 13 and 15 to 17 are plan views showing a portion of the front side of the semiconductor wafer 100 related to FIG. 3.

Figure 4:
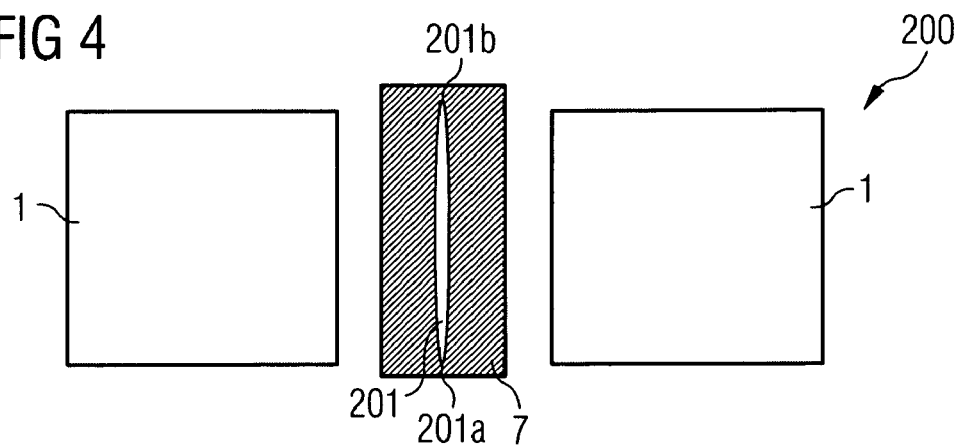
FIG. 4 illustrates a plan view of a semiconductor device according to one embodiment.

According to FIG. 4, a semiconductor device 200 according to one embodiment may include a metallization 7 having a recess formed as a slit-shaped opening 201. The slit-shaped opening 201 may be linear as illustrated in FIG. 4 or may be curved. The slit-shaped opening 201 may be aligned to the moving direction of the laser beam 8, i.e. the laser beam 8 may enter the metallization 7 at the lower end 201a of the slit-shaped opening 201, run from the lower end 201a to the upper end 201b of the slit-shaped opening 201, and may leave the metallization 7. It is to be noted that the majority of the length of the dicing line within the area of the metallization 7 extends through the opening 201, i.e. does not intersect the metallization 7. Thus, on dividing the semiconductor wafer 100, only small portions of the metallization 7 between the outline of the metallization 7 and the lower and upper ends 201a, 201b of the opening 201 have to be torn apart. That way, the individualization of the semiconductor wafer 100 into chips is facilitated and the fray out of the metallization 7 impeded. The disruption of the metallization 7 may further be promoted by an acute-angled shape of the ends 201a, 201b of the slit-shaped opening 201.

It is to be noted that one or both ends 201a, 201b of the opening 201 may be open at the outline of the metallization. In this case, the opening 201 has the shape of a slit-like recess which penetrates from the upper or lower side into the metallization 7 or may even divide the metallization 7 into two spaced apart sections or parts. In the latter case, various measures to electrically couple the space apart parts could be used and will be explained later.

Figure 5:
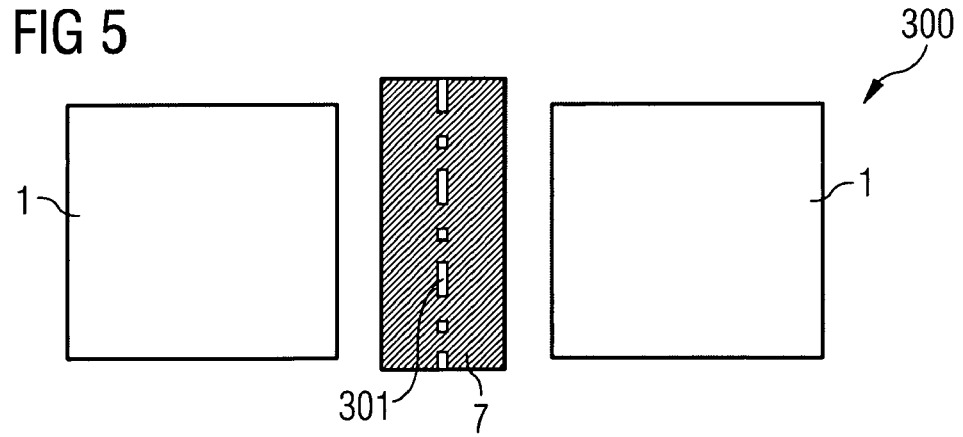
FIG. 5 illustrates a plan view of a semiconductor device according to one embodiment.
Figure 6:
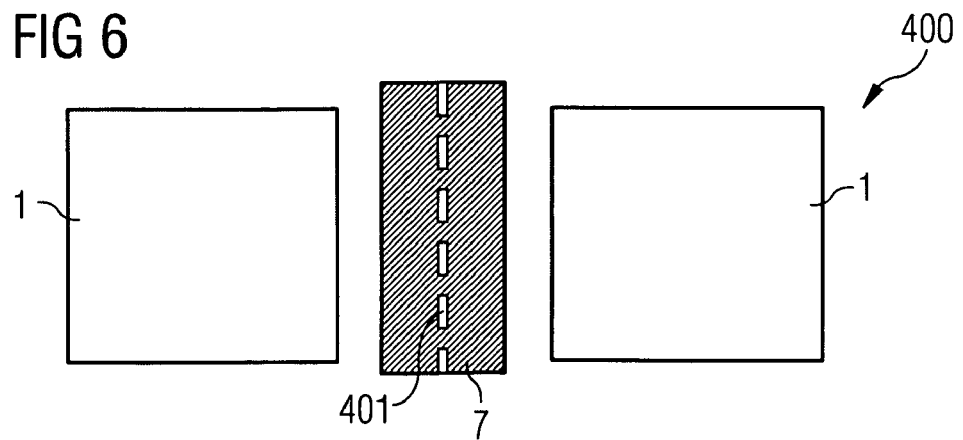
FIG. 6 illustrates a plan view of a semiconductor device according to one embodiment.

FIGS. 5 and 6 illustrate semiconductor devices 300, 400 according to further implementations or embodiments. The above description relating to the semiconductor device 200 largely applies to the semiconductor devices 300 and 400. Both semiconductor devices 300 and 400 have metallizations 7 with recesses 301 and 401 having a slit-like shape, respectively. In semiconductor device 300, multiple recesses 301 are arranged to form the shape of a dash-dotted line, whereas in semiconductor device 400, multiple recesses 401 are arranged to form the shape of a dashed line. In both cases, the cutting line generated by the laser beam 8 only intersects short metallization portions between the recesses 301 and 401, respectively. The recesses 301 and 401 may be oriented in a linear direction or may have a curved run. It is to be noted that in all embodiments 200 to 400, the metallization 7 may remain continuous, that is the slit-shaped recesses 201, 301, 401 may not divide the metallization 7 into separate parts.

Figure 7:
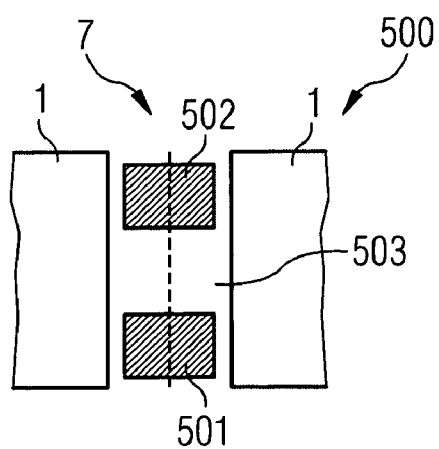
FIG. 7 illustrates a plan view of a semiconductor device according to one embodiment.

A semiconductor device 500 according to FIG. 7 includes a metallization 7 which is composed of two (or more) parts 501, 502 which are separated from each other by a gap 503. By virtue of the gap 503, the total area of the metallization 7 is reduced if compared to a continuous metallization 7 covering also the area of the gap 503. The two or more separate parts 501, 502 may be electrically coupled by lower metallization layers as will be described further below in more detail in conjunction with FIGS. 13 and 14, or may be electrically coupled by a metal coating as will be described.

Figure 8:
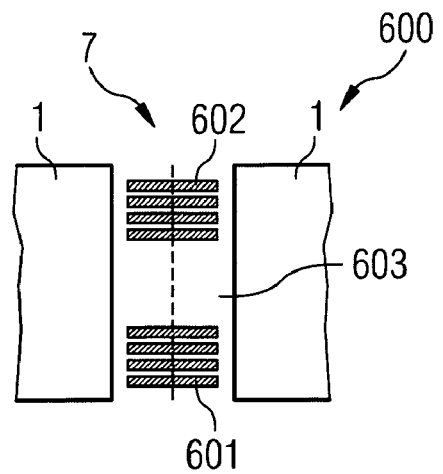
FIG. 8 illustrates a plan view of a semiconductor device according to one embodiment.

FIG. 8 illustrates a semiconductor device 600 according to one embodiment. Semiconductor device 600 is similar to semiconductor device 500 in that the metallization 7 is removed in a central gap region 603 between a lower part 601 and an upper part 602 thereof. Here, the lower part 601 and the upper part 602 of the metallization 7 is configured as a linear array of separated stripes, respectively. The stripes are aligned in a perpendicular direction to the cutting line (i.e. the dotted central line illustrated e.g., in FIGS. 7 to 13). That way the maximum length along which the cutting line intersects a continuous part of the metallization 7 may be significantly reduced compared to semiconductor device 500. Similar to semiconductor device 500 illustrated in FIG. 7, the metallization stripes may be electrically interconnected via internal wafer wiring, cf. FIGS. 13 and 14, via a metal coating, cf. FIGS. 17 and 18, or via an integral connector of the metallization 7 extending parallel but laterally displaced to the cutting line. Further, it is to be noted that the gap region 603 is optional, i.e. the separated stripes may be distributed e.g., under a regular pitch across the area of the metallization 7.

Figure 9:
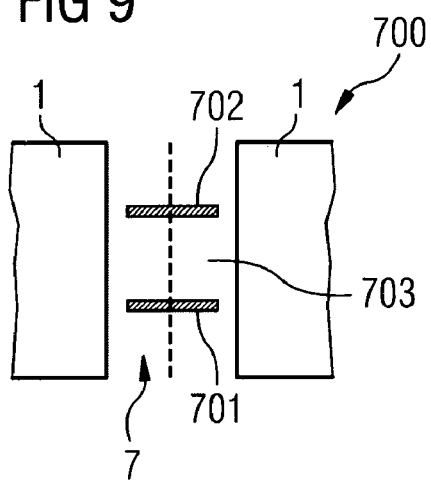
FIG. 9 illustrates a plan view of a semiconductor device according to one embodiment.

FIG. 9 illustrates a semiconductor device 700 according to one embodiment. Here, the metallization 7 is implemented by only two stripes (lower metallization stripe 701, upper metallization stripe 702), which are separated by a gap 703. The description to semiconductor devices 500 and 600 analogously applies to semiconductor device 700.

Figure 10:
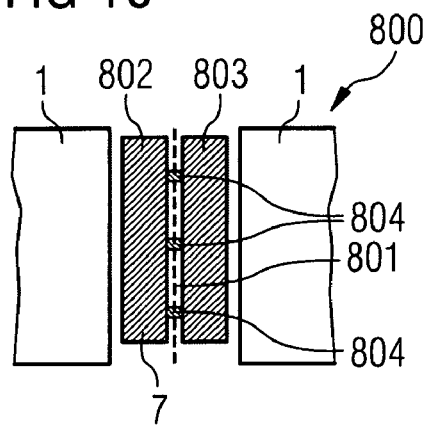
FIG. 10 illustrates a plan view of a semiconductor device according to one embodiment.

FIG. 10 illustrates a semiconductor device 800 which is similar to the semiconductor device 400 illustrated in FIG. 6. The metallization 7 is provided with several slit-shaped recesses 801 which define a left-hand part 802 and a right-hand part 803 of the metallization 7. The left-hand part 802 and the right-hand part 803 of the metallization 7 are interconnected by thin crossbeams 804. Similar to the semiconductor devices 200, 300, 400, the metallization 7 remains continuous. Alternatively, if the crossbeams 804 are omitted, the left-hand part 802 and the right-hand part 803 are spaced apart and may be electrically coupled by using one or both of the techniques described in conjunction with FIGS. 13, 14 and 17, 18, respectively.

Figure 11:
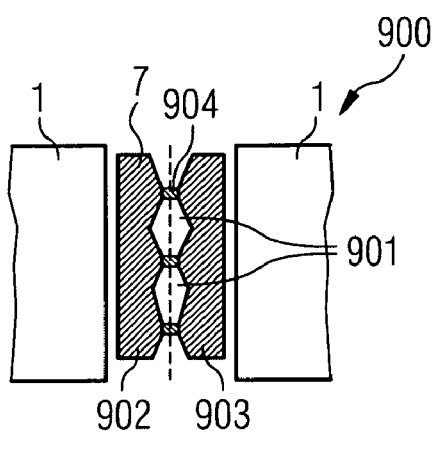
FIG. 11 illustrates a plan view of a semiconductor device according to one embodiment.

FIG. 11 illustrates a semiconductor device 900 according to one embodiment. Semiconductor device 900 is similar to semiconductor device 800 illustrated in FIG. 10. Again, the metallization 7 is provided with several slit-shaped recesses 901 which define a left-hand part 902 and a right-hand part 903, which are interconnected by crossbeams 904. In contrast to the semiconductor device 800, the slit-shaped recesses 901 have a larger cross dimension in their central region than at their end regions. By way of example, to this end, the slit-shaped recesses 901 may have a hexagonal shape rather than a rectangular shape. By broadening the aperture width of the recesses 901 in lateral direction, embodiment illustrated in FIG. 11 may be less sensitive to positional tolerances or wafer displacement than the embodiment illustrated in FIG. 10. Apart from this, the description to semiconductor device 800 applies to semiconductor device 900.

Figure 12:
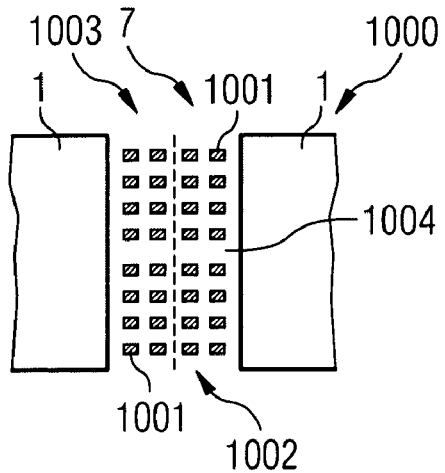
FIG. 12 illustrates a plan view of a semiconductor device according to one embodiment.

FIG. 12 illustrates a semiconductor device 1000 using a metallization 7 which is configured as an array or matrix of separate metallization zones 1001. The array may optionally be split into two sub-arrays (lower sub-array 1002 and upper sub-array 1003) which are separated by a gap 1004. The gap 1004 may have a width which is larger than the distance between two neighboring metallization zones 1001. Alternatively, an array with regular pitch may be employed.

Figure 13:
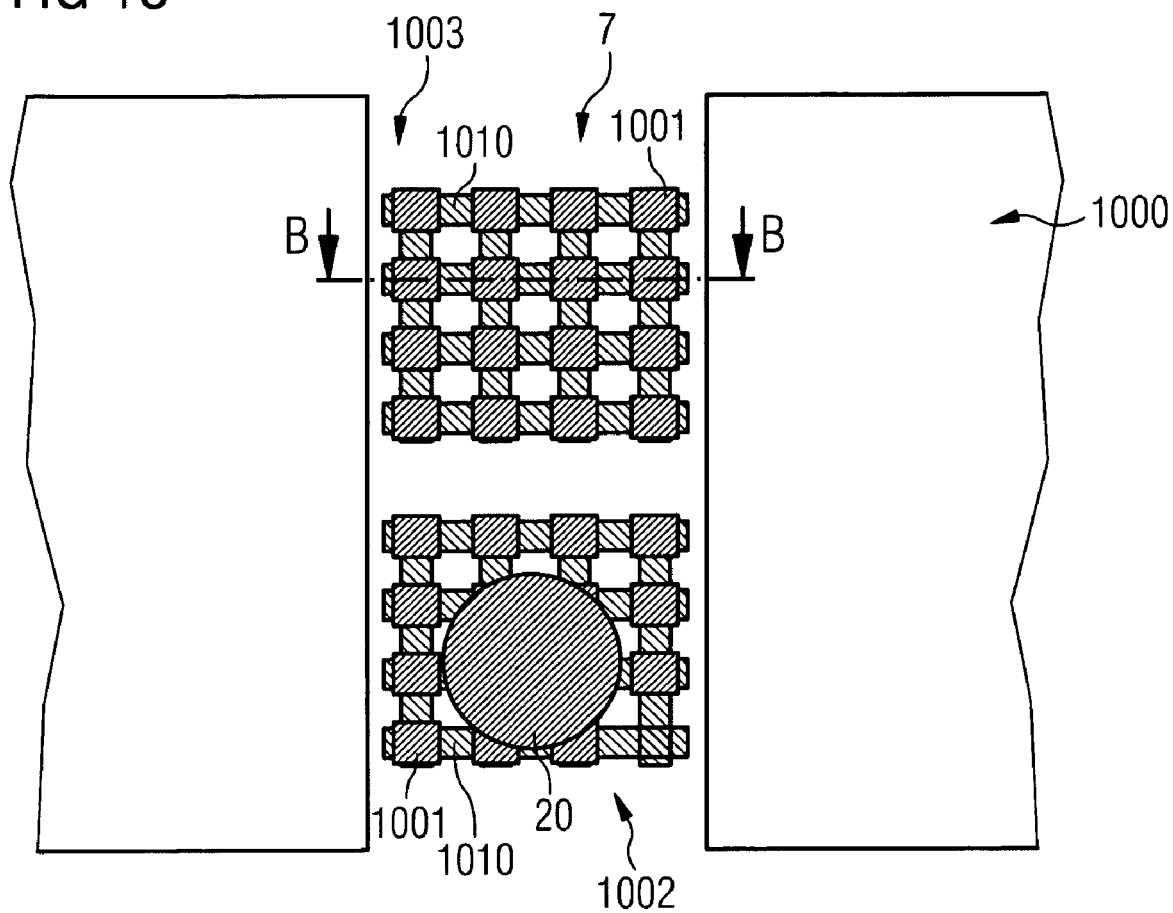
FIG. 13 illustrates a semi-transparent plan view of a semiconductor device according to one embodiment.

FIG. 13 is a semi-transparent illustration of the semiconductor device 1000 illustrated in FIG. 12. Here, additional to the metal layer implementing the metallization 7 (i.e. the metallization zones 1001), a lower metal layer 1010 serving as an electrical interconnect for the metallization zones 1001 is illustrated. By way of example, FIG. 13 reveals that the upper sub-matrix 1003 and the lower sub-matrix 1002 are electrically isolated, whereas all metallization zones 1001 of the upper sub-matrix 1003 and all metallization zones 1001 of the lower sub-matrix 1002 are electrically interconnected by the lower metal layer 1010, respectively. Further, FIG. 13 illustrates the imprint 20 of a probe or contact pin pressed on the lower sub-matrix 1002.

Figure 14:
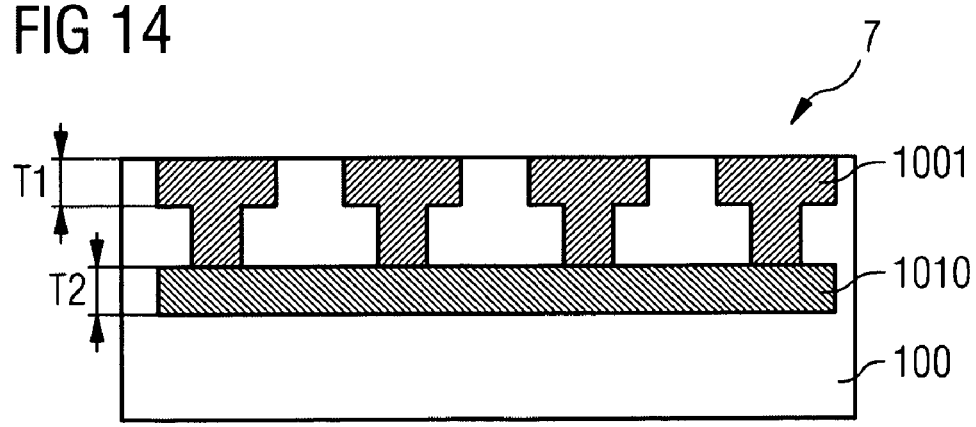
FIG. 14 illustrates a sectional view along line B-B of one embodiment of the semiconductor device illustrated in FIG. 13.

FIG. 14 illustrates a sectional view along line B-B in FIG. 13. As already mentioned, the metallization 7 (in this example represented by the metallization zones 1001) may be made of the uppermost metal layer in a semiconductor wafer or chip and the interconnect may be made of a lower metallization layer 1010 within the semiconductor wafer or chip. The uppermost metal layer of a semiconductor wafer is often referred to as metal1, and the lower metallization layers within a semiconductor wafer are often referred to as metal2, metal3, metal4, .... Using this notation, the metallization 7 may be structured out of metal1, whereas any of the lower metallization layers metal2, metal3, ... may be used to provide for the interconnect 1010.

Throughout all embodiments, the metallization 7 may be made of a metal which is different from the metal used for the interconnect. Further, different thicknesses of these layers may be used. By way of example, metal1 forming the metallization 7 may have a thickness T1 of more than 1 µm, in particular more than 2 µm. For instance, thickness T1 may be in the range between 3 µm to 4 µm. In another embodiment, thickness T2 of lower metal layers (metal2, metal3, ... ) may be smaller than 1 µm, in particular smaller than 500 nm. As an example, T2 may be in the range between 200 nm and 500 nm.

It is to be noted that the structure or redesign proposed for metallization 7 according to embodiments disclosed herein may also apply for the lower metal layers metal2, metal3, ... of the interconnect. More specifically, each design of metallization 7 disclosed herein may be applied to each of the lower metal layers within the semiconductor wafer. However, as these layers (metal2, metal 3, ... ) are usually thinner than the uppermost metal layer (metal1), the impact of the lower metal layers may be less critical than the impact of the uppermost metal layer (metal1) with regard to the dicing of the semiconductor wafer.

In the following, typical dimensions of the metallization 7 that apply for all embodiments are given. The outline of the metallization 7 may cover a total area having a width of e.g., about 30 µm to 60 µm in lateral direction and a length (in longitudinal direction, i.e. parallel to the dicing street 4) of e.g., about 50 µm to 120 µm. However, especially the length of the outline of the metallization 7 may be larger or smaller than the above mentioned range and may, for instance, be as large as 200 µm, 300 µm or even more. The maximum width dimension of the slit-shaped recesses 201, 301, 401, 801, 901 as well as the distance in lateral direction between metallization zones 1001 in FIGS. 12 and 13 may be in the range between 5 µm to 15 µm, more specifically 6 µm to 10 µm. Typically, the lateral dimension of the damaging zone created by stealth dicing is less than 3 µm, so that the required width of the slit-shaped recesses 201, 301, 401, 801, 901 may mainly be governed by the maximum positional tolerances involved in the laser dicing process. Especially in the case of large positional tolerances, the maximum width dimension of the slit-shaped recesses 201, 301, 401, 801, 901 may be chosen larger than 15 µm and may only be limited by the requirement to provide sufficient metal in order to offer a secure electrical contact to the probe.

Another quantity to be considered when dimensioning the metallization 7 is the maximum length along which the cutting line intersects a continuous portion of the metallization 7. In one embodiment, this sectional length is smaller than 200 µm, 100 µm or 50 µm. For instance, referring by way of example to the semiconductor devices 200, 300, 400, 600, 700, 800, 900, 1000 and the dimension of metallization elements such as e.g., 701, 702, 804, 904, 1001 crossing the cutting line, the sectional length may be as small as e.g., 20 µm, 10 µm, 5 µm or even less. Moreover, it is possible that a slit-shaped recess arranged within the metallization 7 completely penetrates the metallization 7 and thus divides it into two separate parts, resulting in a reduction of the sectional length to 0 µm.

Figure 15:
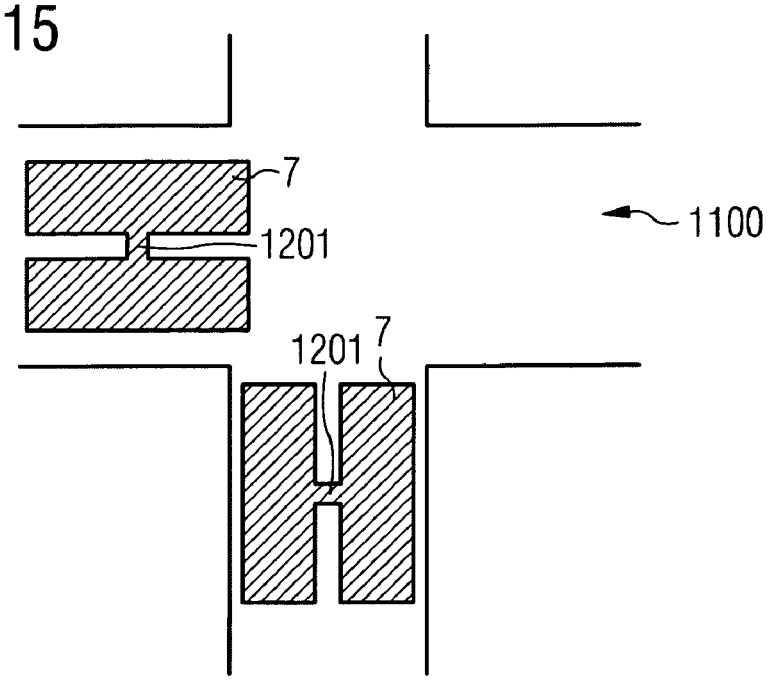
FIG. 15 illustrates plan view of a semiconductor device according to one embodiment.
Figure 16:
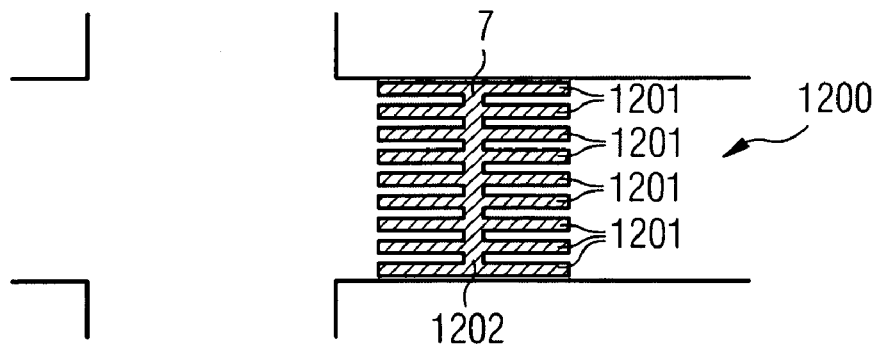
FIG. 16 illustrates a plan view of a semiconductor device according to one embodiment.
Figure 17:
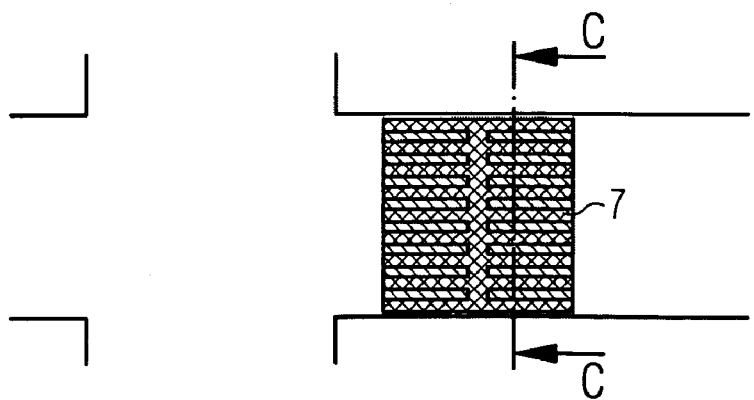
FIG. 17 illustrates a semi-transparent plan view of one embodiment of the semiconductor device illustrated in FIG. 16.

FIGS. 15 and 16 illustrate semiconductor devices 1100, 1200 according to further embodiments. Here, a dicing street intersection is illustrated. In FIG. 15, the metallization 7 is designed similar to the two part type metallization 7 in FIG. 10. However, only one crossbeam 1201 is used. Layout, configuration and dimensions may be chosen as mentioned before.

The semiconductor device 1200 illustrated in FIG. 16 uses a metallization 7 having a number of parallel stripes 1201 arranged in the direction of the cutting line (not illustrated) and connected by a cross element 1202. The cutting line should extend through one of the gaps between the parallel stripes 1201. Further, as an alternative realization, the cross element 1202 of the metallization 7 could be omitted and electrical contact between the stripes 1201 could be provided by lower metal layers within the semiconductor substrate as explained above in conjunction with FIGS. 13 and 14.

Further, according to another aspect, the metallization 7 may be composed of a plurality of different metal layers. By way of example, this aspect is exemplified in conjunction with FIGS. 17 and 18 using, only for the purpose of explanation, the embodiment illustrated in FIG. 16. More specifically, a cover layer 2000 made of metal material is coated on the stripes 1201 (or any other design of the metallization 7 disclosed further above). The cover layer 2000 has a smaller thickness than the stripes 1201 which serve as a basis for the cover layer 2000. For instance, the cover layer 2000 may have a thickness smaller than 1 μm, in particular smaller than 500 nm or even smaller than 300 nm. The cover layer 2000 may be a continuous layer without recesses or openings, and may cover a part of the metallization 7 located in a zone of laser dicing or substantially the entire area of the metallization 7 within the outline thereof. Again, laser dicing is performed along a cutting line running in a gap between the stripes 1201. Due to the small thickness of the cover layer 2000, the separation of the semiconductor wafer 100 into chips is not seriously impeded by the cover layer 2000. The cover layer 2000 may enhance the electrical contact to a control pin or probe pressed on the metallization 7. Further, the cover layer 2000 is effective to electrically interconnect the entire underlying structure of the metallization 7 irrespective of its design. Therefore, the cover layer 2000 allows to omit (e.g., replaces) an internal wiring required for interconnecting separate parts of the metallization 7 as, for instance, illustrated in FIGS. 7, 8, 9 and 12. The concept of adding a thin cover layer 2000 (metal coating) to the metallization 7 may be applied to each of the embodiments described herein. The cover layer 2000 may be made of a material different than the material of the stripes 1201. For instance, the cover layer 2000 may be made of gold, whereas the stripes 1201 may be made of one of the aforementioned materials used for the metallization 7 (without cover layer 2000).

In conclusion, a semiconductor device as described herein may include a semiconductor substrate having a plurality of cut regions. A metal layer is located within a cut region. The metal layer includes a recess, the recess having a slit-like shape. The recess may be formed as an opening or a partial intersection of the metal layer or may divide the metal layer in a first section and a second section being spaced apart from each other. Sections of the metal layer may be electrically interconnected by an internal interconnect within the semiconductor device and/or a cover layer may overlay at least partially the recess and at least parts of the metal layer.

In the following, methods of manufacturing semiconductor devices according to embodiments will be described herein with reference to flow charts illustrated in FIGS. 19 and 20.

According to FIG. 19, at S1 a semiconductor wafer 100 having a plurality of active regions therein is prepared, wherein the active regions being separated by cut regions (dicing streets). Preparation of a semiconductor wafer is accomplished in front-end processing. The raw semiconductor wafer, which may have a diameter of e.g., 300 mm, is engineered by forming a plurality of semiconductor components (e.g., integrated circuits, MEMS) on a main surface of the semiconductor wafer. Front-end processing may include impurity doping, various deposition steps, photolithography steps (e.g., for patterning the gate, source and drain regions of transistors), etching steps and metallization steps. Further, in front-end processing the semiconductor components are interconnected by metal wires. To this end, a number n of metal layers (metaln, metaln−1, . . . , metal1) are deposited, patterned and etched, leaving isolated wires. Dielectric material is deposited over the exposed wires, and holes, called vias, are generated in the dielectric material to electrically connect wires of different metal layers. Still during front-end processing (i.e. wafer fabrication), the chip electrode pads 2 and metallizations 7 are generated. In order to generate the metallizations 7, at S2, a metal layer located within a cut region, wherein the metal layer has a recess, the recess having a slit-like shape, is generated. Typically, S2 includes a metal deposition process. The metal may be deposited by all known techniques, i.e. CVD (Chemical Vapor Deposition), PVD (Physical Vapor Deposition), e.g., sputtering, or by galvanic or electroless plating. It is to be noted that various kinds of these techniques may be combined. For instance, a seed layer may be applied by vapor deposition techniques, structured by photolithography techniques and enhanced by plating techniques. The recess within the metal layer (metallization 7) or a pattern of such recesses may be generated simultaneously during the deposition of the metal using a mask deposition process, or at a later stage using post-deposition structuring techniques such as etching etc.

Once the front-end processing has been completed, the chips on the semiconductor wafer 100 are subjected to a variety of electrical tests to determine if they function properly. The chips on the semiconductor wafer 100 are typically tested with an external electronic tester that presses tiny probes against the metal layer (metallizations 7) on the surface of the semiconductor wafer 100. Further, wafer burn-in processing may be accomplished using probes connected to external electronic burn-in equipment.

After testing and/or burn-in processing, the semiconductor wafer is subjected to back-end processing. Back-end processing may include taping the semiconductor wafer 100 on an expandable tape 9 and back-grinding the semiconductor wafer 100. At S3 of FIG. 19, separating the semiconductor wafer into at least two semiconductor units is performed by laser dicing, wherein the cutting line runs through the recess or recesses in the metal layer generated during S2. Laser dicing, e.g., stealth dicing, may be performed from the ground back surface of the semiconductor wafer 100 as illustrated in FIG. 2. In contrast to conventional blade dicing, where the semiconductor units (chips) are completely separated, the stealth dicing method allows the individual chips to be still integrated with the semiconductor wafer 100 even after stealth dicing. The stealth-diced chips are separated afterwards by tape expansion. Tape expansion is facilitated and quality thereof is improved by the aspects and principles described herein. Subsequent processing may include pick-up and packaging steps such as die-bonding, wire-bonding and encapsulation.

Figure 20:
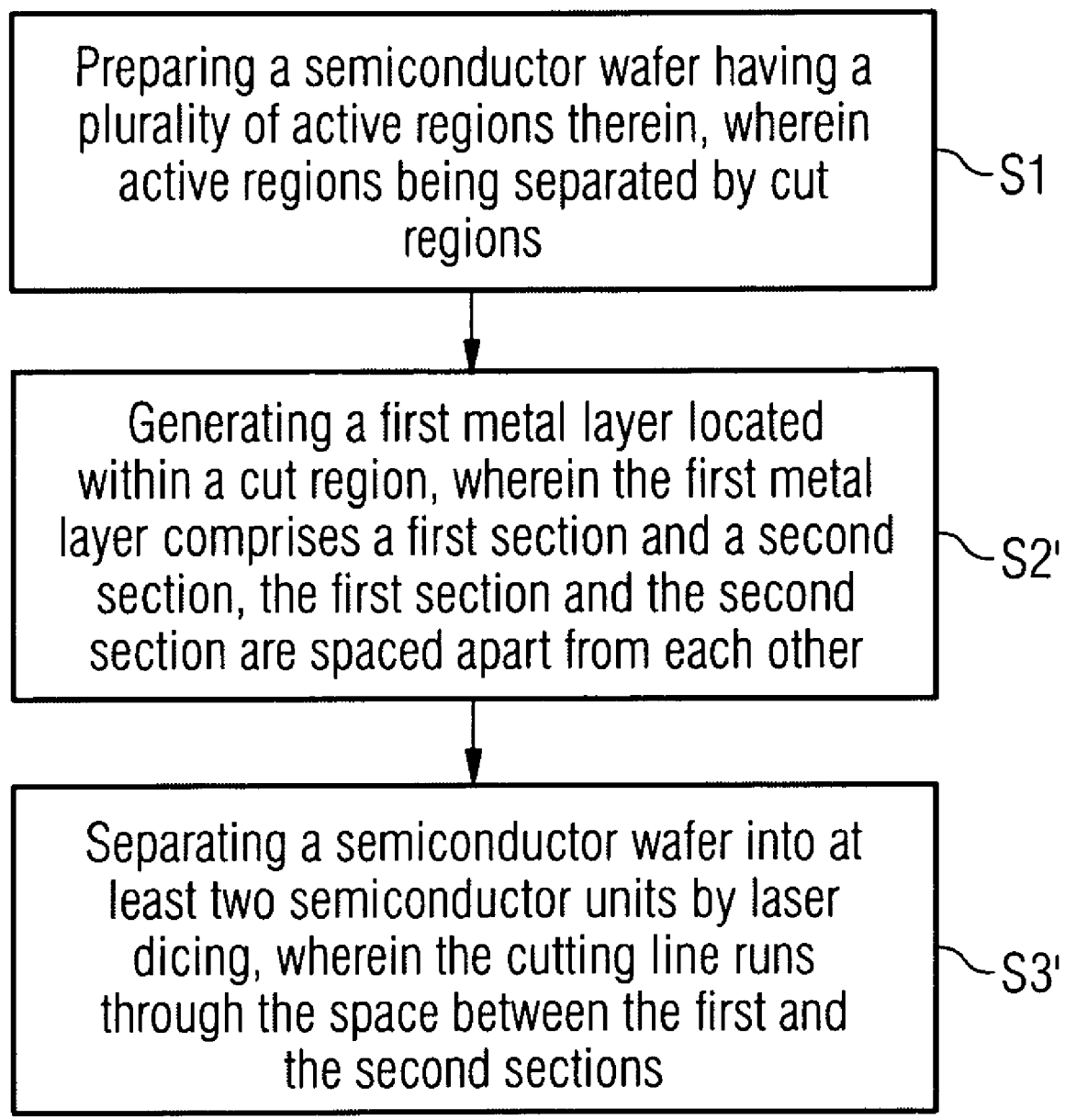
FIG. 20 illustrates a flow diagram of a method of producing semiconductor units according to one embodiment.

According to FIG. 20, a manufacturing process may include the preparation of a semiconductor wafer 100 having a plurality of active regions therein, wherein active regions being separated by cut regions (dicing street) according to S1. Then, according to S2', a first metal layer located within a cut region is generated. The first metal layer includes a first section and a second section, wherein the first section and the second section are spaced apart from each other and are electrically interconnected by one of the aforementioned techniques. Subsequently, at S3', the semiconductor wafer 100 is separated into at least two semiconductor units. The separation is performed by laser dicing, e.g., stealth dicing, wherein the cutting line runs through the space between the first and the second sections. Further, it is to be noted that all further processing options as explained in conjunction with the flow chart of FIG. 19 are equally applicable to the process illustrated by the flow chart of FIG. 20.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. This application is intended to cover any adaptations or variations of the specific embodiments discussed herein, and the invention is intended to be limited only by the claims and the equivalence thereof.

What is claimed is:

1. A semiconductor device comprising:
a semiconductor substrate comprising:
   a plurality of cut regions; and
   a metal layer located within a cut region,
      wherein the metal layer comprises a recess, the recess having a slit-like shape;
      wherein an end of the recess comprises an acute-angled shape; and
      wherein the recess has a maximum dimension of more than 10 µm in a transverse direction to the slit direction.

2. The semiconductor device of claim 1, comprising wherein the recess is formed as an opening in the metal layer.

3. The semiconductor device of claim 1, wherein the metal layer comprises a plurality of recesses having a slit-like shape and being arranged in a linear configuration.

4. The semiconductor device of claim 1, wherein the recess comprises at least one angled end.

5. A semiconductor device comprising:
a semiconductor substrate comprising:
   a plurality of cut regions;
   a first metal layer located within a cut region, wherein the first metal layer comprises at least one first section and at least one second section, the first section and the second section being spaced apart from and electrically coupled to each other; and
   a second metal layer being arranged beneath the first metal layer, wherein the second metal layer is used for electrically connecting the first section to the second section.

6. The semiconductor device of claim 5, comprising wherein the first and the second sections have the shape of stripes.

7. A semiconductor device comprising:
a semiconductor substrate comprising:
   a plurality of cut regions; and
   a first metal layer located within a cut region, wherein the first metal layer comprises a first section and a second section being spaced apart from each other, wherein each of the first section and the second section comprises multiple stripes, the stripes being electrically coupled to each other by a conductive element;
   wherein the stripes of the first section and the second section are oriented in a direction parallel to a cutting direction defined by the cut region, and
   wherein the conductive element is arranged between the first section and the second section and is oriented in a direction perpendicular to the cutting direction.

8. The semiconductor device of claim 6, comprising wherein the first and the second sections are oriented in a direction perpendicular to a cutting direction defined by the cut region.

9. The semiconductor device of claim 5, comprising wherein the first and the second sections are spaced apart by more than 5 µm.

10. The semiconductor device of claim 5, comprising wherein the first and the second sections each have a maximum dimension in a direction parallel to a cutting direction defined by the cut region of 200 µm.

11. The semiconductor device of claim 5, further comprising:
a plurality of additional spaced-apart sections of the first metal layer, the sections having the shape of stripes and being electrically coupled to each other.

12. The semiconductor device of claim 5, further comprising:
a plurality of additional spaced-apart sections of the first metal layer, the sections being disposed in a two-dimensional array pattern and being electrically coupled to each other.

13. The semiconductor device of claim 5, comprising wherein the first metal layer has a thickness larger than 2 µm, and the second metal layer has a thickness smaller than 500 nm.

14. The semiconductor device of claim 7, wherein the first section and the second section are on identical geometrical shape.

* * * * *